US010468435B2

(12) United States Patent
Kim et al.

(10) Patent No.: US 10,468,435 B2
(45) Date of Patent: Nov. 5, 2019

(54) DISPLAY PANEL AND DISPLAY DEVICE INCLUDING DISPLAY PANEL

(71) Applicant: LG Display Co., Ltd., Seoul (KR)

(72) Inventors: JaeBok Kim, Gumi-si (KR); WonSub Yoon, Paju-si (KR); JiHong Park, Suwon-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/119,994

(22) Filed: Aug. 31, 2018

(65) Prior Publication Data
US 2019/0123071 A1 Apr. 25, 2019

(30) Foreign Application Priority Data
Oct. 23, 2017 (KR) .......... 10-2017-0137593

(51) Int. Cl.
H01L 23/48 (2006.01)
H01L 23/52 (2006.01)
H01L 29/40 (2006.01)
H01L 27/12 (2006.01)
H01L 23/00 (2006.01)
H01L 23/498 (2006.01)

(52) U.S. Cl.
CPC ...... H01L 27/1244 (2013.01); H01L 23/4985 (2013.01); H01L 23/49838 (2013.01); H01L 24/06 (2013.01); H01L 24/08 (2013.01); H01L 24/32 (2013.01); H01L 27/1218 (2013.01); H01L 2224/0603 (2013.01); H01L 2224/06133 (2013.01); H01L 2224/08121 (2013.01); H01L 2224/08225 (2013.01); H01L 2224/32227 (2013.01)

(58) Field of Classification Search
CPC .......... H01L 24/06; H01L 2224/32227; H01L 2224/0612; H01L 2224/06153; H01L 27/1244; H01L 27/3241; H01L 27/3244; H01L 2224/08121; H01L 23/4985
USPC ........................................ 257/678, 784, 786
See application file for complete search history.

(56) References Cited

U.S. PATENT DOCUMENTS

| | | | | |
|---|---|---|---|---|
| 8,698,391 B2* | 4/2014 | Cok | ..................... | H01L 27/3255 313/505 |
| 2010/0277440 A1* | 11/2010 | Cok | ..................... | H01L 27/3255 345/204 |
| 2014/0124803 A1* | 5/2014 | Kwack | ..................... | H01L 24/06 257/91 |
| 2018/0014405 A1* | 1/2018 | Kim | ..................... | H01L 24/29 |

* cited by examiner

Primary Examiner — S. V. Clark
(74) Attorney, Agent, or Firm — Fenwick & West LLP

(57) ABSTRACT

A display panel includes signal wires arranged in an active area, connection wires arranged in a non-display area adjacent to the active area electrically connected to the plurality of signal wires, and panel pads in the non-display area that are electrically connected to the plurality of connection wires. The panel pads include a first panel pad row arranged in a first direction, a second panel pad row arranged in the first direction, and a gap between the first panel pad row and the second panel pad row along the first direction. The first panel pad row and the second panel pad row include extended panel pads extended toward an adjacent panel pad row so as to reduce a swelled region in the gap.

20 Claims, 13 Drawing Sheets

Panel Pad
COF Pad

Panel Pad
COF Pad

DISPLAY PANEL AND DISPLAY DEVICE INCLUDING DISPLAY PANEL

CROSS REFERENCE TO RELATED APPLICATION

This application claims priority from Republic of Korea Patent Application No. 10-2017-0137593, filed on Oct. 23, 2017, in the Korean Intellectual Property Office, the disclosure of which is incorporated by reference in its entirety.

BACKGROUND

1. Technical Field

Present disclosure relates to a display panel and a display device including the display panel.

2. Description of the Related Art

Demands for various types of display devices for displaying images are increasing. Accordingly, various kinds of display devices, such as a Liquid Crystal Display (LCD) device, a plasma display device (PDP), a Micro LED display device, a Quantum-dot Light Emitting Display (QLED) device, an Organic Light Emitting Display (OLED) device, and etc. are being utilized.

A display device includes a display panel including an active area, in which a plurality of sub-pixels is arranged, a non-display area in a periphery area of the active area, and a drive circuit configured to drive the plurality of sub-pixels.

The display panel may include a plurality of signal wires, i.e., a plurality of signal lines connecting the plurality of sub-pixels and the drive circuit. The signal wires may be connected to the drive circuit via pads disposed in the non-display area of the display panel.

For example, a plurality of data wires, i.e., a plurality of data lines for supplying data voltages to respective sub-pixels is disposed on a display panel. The plurality of data wires is respectively connected to the plurality of pads disposed in the non-display area. Therefore, the plurality of data wires may be connected to the drive circuit via the plurality of pads.

Conventional arrangement of the pads may be provided in a single row.

SUMMARY

An arrangement of the plurality of pads can be provided more than two rows as the number of data wires increases with a demand for high pixel-resolution of the display panel.

There may be a certain distance or a gap between adjacent rows of the plurality of pads.

A swelling phenomenon can occur during a bonding process of a display device that bonds the plurality of pads of the display panel and the plurality of pads of the drive circuit. That is, the swelling phenomenon may occur due to a bonding pressure that may vary, applied to the pads of the display panel and the materials of the substrate of the display panel for supporting the plurality of pads of the display panel. In particular, the swelling phenomenon may occur in a gap between adjacent rows of the plurality of pads. Accordingly, a swelled region may be formed in the gap between adjacent rows of the plurality of pads.

If the data wires, connected to one of the rows of the plurality of pads, are disposed in the swelled region, then the data wires disposed in the swelled region can be damaged or cracked.

An aspect of the embodiments of the present disclosure may be to provide a display panel comprising a plurality of signal wires arranged in an active area, a plurality of connection wires, arranged in a non-display area adjacent to the active area, electrically connected to the plurality of signal wires, and a plurality of panel pads, in the non-display area, electrically connected to the plurality of connection wires comprising a first panel pad row among the plurality of panel pads arranged in a first direction, a second panel pad row among the plurality of panel pads arranged in the first direction, and a gap between the first panel pad row and the second panel pad row along the first direction, wherein at least one of the first panel pad row and the second panel pad row include a plurality of extended panel pads extended toward an adjacent panel pad row so as to reduce a swelling in the gap.

At least two panel pads of the first panel pad row may be extended toward the second panel pad row, at least two panel pads of the second panel pad row may be extended toward the first panel pad row, and the extended panel pads of the first and second panel pad rows are alternately arranged.

At least one panel pad shorter than the plurality of extended panel pads of the first panel pad row may be positioned between the plurality of extended panel pads in the first panel pad row, and at least one panel pad shorter than the plurality of extended panel pads of the second panel pad row may be positioned between the plurality of extended panel pads in the second panel pad row.

At least two panel pads of the first panel pad row may be longer than the other panel pads of the first panel pad row, and the plurality of panel pads of the first panel pad row may have a same width.

At least two panel pads of the first panel pad row are extended toward the second panel pad row.

A first width of the panel pads of the first panel pad row may be wider than a separation space between the panel pads of the first panel pad row along the first direction, and a second width of the panel pads of the second panel pad row may be wider than a separation space between the panel pads of the second panel pad row along the first direction.

The display panel may include a film comprising a plurality of film pads correspondingly bonded to the plurality of panel pads, the plurality of film pads of the film has the same shape, and the extended panel pads among the first and second panel pad rows may be larger than the plurality of film pads.

The display panel may include a film comprising a plurality of film pad rows and a plurality of swelled regions formed in a misaligned manner in the first direction between the plurality of film pad rows.

The display panel may include a third panel pad row among the plurality of panel pads arranged in the first direction, a second gap between the second panel row and the third panel row along the first direction, wherein the adjacent panel pad row of the second panel pad row includes the first panel pad row and the third panel pad row. The third panel pad row may include at least one panel pad extended toward the second panel pad row.

Another aspect of the embodiments of the present disclosure may be to provide a display panel comprising a plurality of panel pads comprising a plurality of panel pad rows arranged in a first direction in a non-display area, at least one gap between the plurality of panel pad rows in the first direction, a plurality of connection wires extended from the plurality of panel pads, respectively, and towards a display area adjacent to the non-display area, wherein the plurality of connection wires, may be extended from one panel pad row among the plurality of panel pad rows, may be passing through the at least one gap, and may be passing through respective separation spaces between the plurality of panel pads of an adjacent panel pad row, wherein a contour of the at least one gap between the plurality of panel pad rows comprises concave and convex sections due to a plurality of extended pads of the plurality of panel pad rows.

The plurality of panel pads includes at least one particular panel pad having a shape different from a shape of other panel pads to form a concave section or a convex section of the contour of the at least one gap.

The plurality of panel pads may include at least one particular panel pad shifted from the other panel pads to form a concave section or a convex section of the contour of the at least one gap.

The other aspect of the embodiments of the present disclosure may be to provide a display device comprising a back-plate, an adhesive layer on the back-plate, a flexible substrate on the adhesive layer, a plurality of panel pad rows on the flexible substrate, a first gap between the plurality of panel pad rows, a plurality of film pad rows bonded to the plurality of panel pad rows, a second gap between the plurality of film pad rows, and a film on the plurality of film pad rows, wherein a first middle line segment along a first direction between a first panel pad in a first panel pad row and a first panel pad in a second panel pad row is misaligned from a second middle line segment between a second panel pad in the first panel pad row and a second panel pad in the second panel pad row, wherein the first middle line segment is at a same distance from an edge of the first panel pad in the first panel pad row and an edge of the first panel pad in the second panel pad row, and the second middle line segment is at a same distance from an edge of the second panel pad in the first panel pad row and an edge of the second panel pad in the second panel pad row.

The plurality of panel pads of the plurality of panel pad rows may include at least one extended pad in the second direction different from the first direction.

The plurality of panel pads of the plurality of panel pad rows may include at least one shifted pad in a second direction different from the first direction.

The plurality of panel pads may have a rigid characteristic.

The at least two misaligned swelled regions may be generated by deformation of the adhesive layer and a flexible characteristic of the flexible substrate.

The first gap may be divided into sections in accordance with at least two extended or shifted panel pads of the plurality of panel pad rows.

The second gap may be divided into sections in accordance with at least two extended or shifted panel pads of the plurality of panel pad rows.

The other aspect of embodiments of the present disclosure may be to provide a display panel and a display device having a pad structure capable of minimizing defective crack in signal wires due to a swelling phenomenon of a circuit board between pads arranged in different rows in the process of bonding pads arranged in two or more rows.

In one aspect, embodiments of the present disclosure provide a display panel including: a plurality of signal wires arranged in an active area; a plurality of connection wires arranged in a non-display area which is an outer area of the active area and integrated with or connected to the plurality of signal wires; and a plurality of panel pads located in the non-display area and connected to the plurality of connection wires.

The plurality of panel pads may form a first panel pad row including two or more panel pads arranged in one direction, and a second panel pad row including two or more panel pads arranged in a region corresponding to a region between the panel pads included in the first panel pad rows, and some of the plurality of panel pads included in the first panel pad row and the second panel pad row may be arranged in a form extended toward the other panel pad row.

Alternatively, the plurality of panel pads may form two or more panel pad rows each including two or more pads, and some of the plurality of panel pads included in an outermost panel pad row among the two or more panel pad rows may be arranged in an inwardly extended form.

Alternatively, the plurality of panel pads form a first panel pad row including two or more panel pads and a second panel pad row including two or more panel pads. The second panel pad row may be located closer to the active area than the first panel pad row, and at least two panel pads included in the first panel pad row and two or more panel pads included in the second panel pad row have inner edges to which the connection wires are connected, respectively, and outer edges opposite the inner edges. The inner edges of two or more respective panel pads included in the first panel pad row may not be located on one straight line, or the outer edges of two or more respective panel pads included in the second panel pad row may not be located on one straight line.

In another aspect, embodiments of the present disclosure provide a display device including: a display panel including an active area and a non-display area which is an outer area of the active area and including a plurality of panel pads arranged in the non-display area; and a film having a plurality of film pads connected to the plurality of panel pads, respectively, and a printed circuit mounted thereon. The plurality of panel pads form a first panel pad row including two or more panel pads arranged in one direction, and a second panel pad row including two or more panel pads arranged in a region corresponding to a region between the panel pads included in the first panel pad rows. The plurality of panel pads have centers of weight, respectively, a plurality of traverse axis straight lines appear when one of the centers of weight is connected to other centers of weight of the panel pads in the same row, and the plurality of transverse axis lines have a slope different from a slope of other transverse axis lines connected in close proximity.

According to embodiments of the present disclosure, in a pad structure in which pads are arranged in two or more rows, by arranging some of the pads arranged in different rows to be extended or shifted toward the other rows, regions in which a swelling phenomenon occurs between the pads of the different rows may not to be located on a straight line.

Accordingly, by making swelled regions between the pads of different rows dispersed, the signal wires, which are connected to the pads via the swelled regions, can be prevented from cracking.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION OF THE EXEMPLARY EMBODIMENTS

Figure 1:
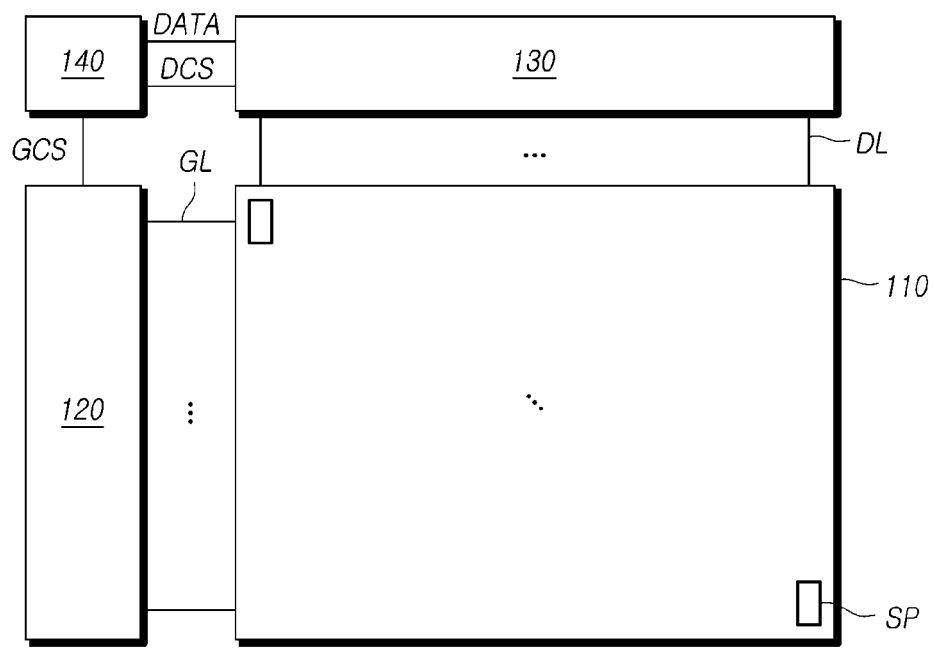
FIG. 1 is a view illustrating a schematic configuration of a display device according to embodiments of the present disclosure.

Hereinafter, some embodiments of the present disclosure will be described in detail with reference to the accompanying illustrative drawings. In designating elements of the drawings by reference numerals, substantially the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is "directly" or "indirectly" connected to another structural element.

FIG. 1 is a view illustrating a schematic configuration of a display device 100 according to an embodiment of the present disclosure.

Referring to FIG. 1, a display device 100 according to an embodiment of the present disclosure may include a display panel 110 including a plurality of gate wires GL, a plurality of data wires DL, and a plurality of sub-pixels SP, a gate drive circuit 120 configured to drive the plurality of gate wires GL, a data drive circuit 130 configured to drive the plurality of data wires DL, and a controller 140 configured to control the gate drive circuit 120 and the data drive circuit 130.

The display panel 110 may include an active area A/A including a plurality of sub-pixels SP for displaying an image and a non-display area N/A at the periphery of the active area A/A.

The gate drive circuit 120 outputs scan signals to the plurality of gate wires GL to control the driving timing of the sub-pixels SP arranged in the active area A/A.

The gate drive circuit 120 sequentially supplies the scan signals with a turn-on voltage or a turn-off voltage to the plurality of gate wires GL by the controller 140 to drive the plurality of gate wires GL.

The gate drive circuit 120 may be located on at least one side of the display panel 110. For example, the gate driver circuit 120 may be disposed on the opposite sides of the display panel 110 according to a driving method of the gate driver circuit 120.

In addition, the gate drive circuit 120 may include one or more Gate Driver Integrated Circuits (GDICs).

Each GDIC may be connected to bonding pads, e.g., a plurality of pads formed on the display panel 110, of the display panel 110 by a Tape Automated Bonding (TAB) method or a Chip on Glass (COG) method or may be implemented in a Gate in Panel (GIP) type so as to be disposed directly on the display panel 110.

In addition, the GDICs may be integrated in the display panel 110 or may be implemented in a Chip on Film (COF) type so as to be mounted on a film connected to the display panel 110.

The data drive circuit 130 outputs a data voltage to the data wires DL in accordance with the timing of applying the scan signals through the gate wires GL so that each sub-pixel SP expresses brightness according to image data.

When a specific gate wire GL is activated, the controller 140 may supply the image data to the data drive circuit 120. The data drive circuit 120 may convert the image data into the analogue image data voltage. The analogue image data voltage may be supplied to the plurality of data wires DL.

The data drive circuit 130 may include one or more Source Driver Integrated Circuits (SDICs) so as to drive the plurality of data wires DL.

Each of the SDICs may be connected to a bonding pad (panel pad) of the display panel 110 by the TAB method or the COG method. Each of the SDICs may be directly disposed on the display panel 110, or may be integrated in the display panel 110.

In addition, each SDIC may be implemented in the COF type. In this case, one end of each SDIC is bonded to at least one source Printed Circuit Board (S-PCB), and the other end is bonded to the display panel 110.

The controller 140 supplies various control signals to the gate drive circuit 120 and the data drive circuit 130 and controls the operations of the gate drive circuit 120 and the data drive circuit 130.

The controller 140 controls a timing of each image frame and rearrange external image data received from the outside into a suitable image data format for the data drive circuit 130. Accordingly, the controller 140 controls a particular data driving timing suitable for gate scanning timing.

The controller 140 receives, from the outside (e.g., a host system), various timing signals including a vertical synchronous signal Vsync, a horizontal synchronous signal Hsync, an input Data Enable (DE) signal, and a clock signal CLK together with input image data.

In other words, the controller 140 may output the rearranged external image data by rearranging the received external image data from the outside that is in a reformatted image data that can be applied to the data drive circuit 130.

Further, the controller 140 may generate various control signals by using the received various timing signals to control the gate drive circuit 120 and the data drive circuit 130, and may output the control signals to the gate drive circuit 120 and the data driving circuit 130.

For example, in order to control the gate drive circuit 120, the controller 140 outputs various Gate Control Signals (GCSs) including a Gate Start Pulse (GSP), a Gate Shift Clock (GSC), a Gate Output Enable (GOE) signal, and the like.

Here, the GSP controls the operation start timing of one or more GDICs constituting the gate drive circuit 120. The GSC may be a clock signal commonly input to the one or more GDICs and controls the shift timing of a scan signal. The GOE signal designates the timing information of the one or more GDICs.

In addition, in order to control the data drive circuit 130, the controller 140 outputs various Data Control Signals (DCSs) including a Source Start Pulse (SSP), a Source Sampling Clock (SSC), a Source Output Enable (SOE) signal, and the like.

Here, the SSP controls the data sampling start timing of one or more SDICs constituting the data drive circuit 130. The SSC may be a clock signal for controlling the sampling timing of data in each of the SDICs. The SOE signal controls the output timing of the data drive circuit 130.

The controller 140 may be disposed on a control PCB, which is connected to a source PCB in which the SDICs are bonded, via a connection medium such as a Flexible Flat Cable (FFC) or a Flexible Printed Circuit (FPC).

A power controller configured to supply various voltages or currents to the display panel 110, the gate drive circuit 120, the data drive circuit 130, and the like or to control the various voltages or currents to be supplied may be further disposed on the control PCB.

In this display device 100, the signal wires arranged on the display panel 110 are connected to the panel pads of the display panel 110 and can be connected to the drive circuit via the panel pads.

However, the present disclosure is not limited to the sub-pixels SP of the display panel 110, the gate drive circuit 120, the data drive circuit 130, and/or the controller 140.

Figure 2:
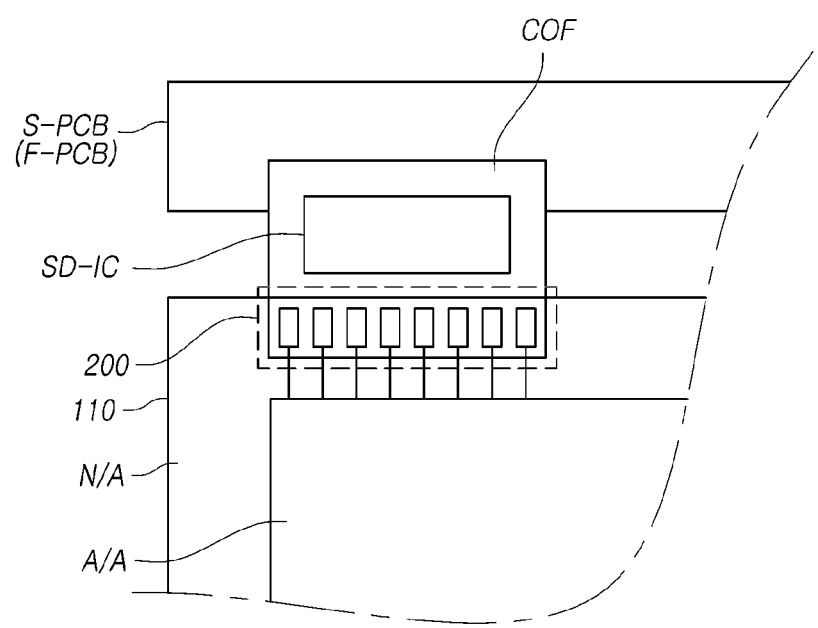
FIG. 2 is a view illustrating an example of a panel pad structure in a display device according to embodiments of the present disclosure.

FIG. 2 illustrates an example of a structure in which the panel pads, signal wires, and a drive circuit of a display panel 110 are connected to each other in a display device 100 according to embodiments of the present disclosure.

Referring to FIG. 2, the display panel 110 may include an active area A/A in which a plurality of sub-pixels SP for displaying an image are arranged and a non-display area N/A adjacent to the active area A/A.

A plurality of panel pads connected to a plurality of signal wires arranged on the display panel 110 may be disposed in the non-display area N/A, and the plurality of panel pads may be arranged along a particular direction. An exemplary plurality of panel pads is illustrated as one panel pad row 200.

Here, the data wires DL illustrated as an example of signal wires are connected to the plurality of panel pads, and the data wires DL arranged in the non-display area N/A may be referred to as connection wires so as to be distinguished from the signal wires arranged in the active area A/A. In other words, a signal wire can be distinguished according to the area where the signal wire is disposed.

That is, the connection wires arranged in the non-display area N/A may be integrated with or connected to the signal wires arranged in the active area A/A. In other words, the connection wire may be extended from the signal wire or the connection wire is a portion of the signal wire.

The panel pads arranged in the non-display area N/A may be connected to film pads arranged on one end of the film. The drive circuit may be mounted on the film. However, the present disclosure is not limited to the position of the drive circuit. In addition, another film pads disposed on the other end of the film may be connected to PCB pads disposed on the source PCB or the flexible PCB.

Although the panel pads connected to such film pads may be arranged in a single row, the panel pads may be arranged in more than two rows as the number of data wires DL increases according to a demand for a high-resolution display device. In addition, the size, the pitch, and/or the density of the panel pads and the size, the pitch, and/or the density of the film pads may be different from each other.

Figure 3:
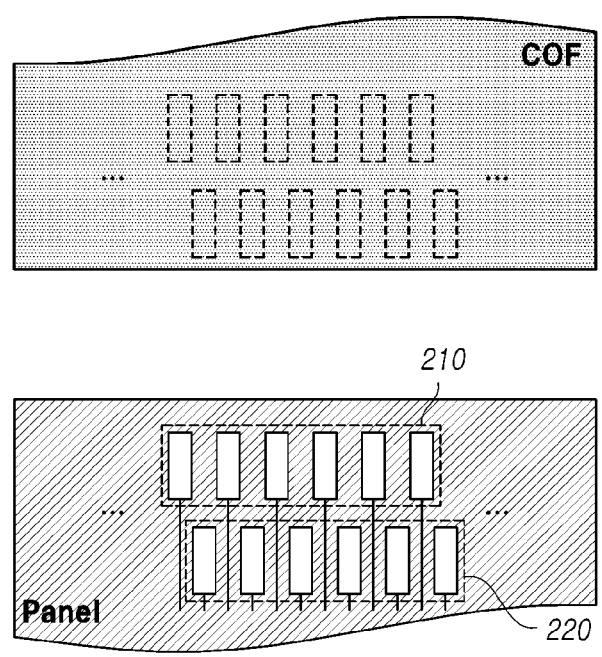
FIG. 3 is a view illustrating an example of structures of panel pads and film pads arranged in two rows in a display device according to embodiments of the present disclosure.

FIG. 3 is a view illustrating an example of a structure in which panel pads are arranged in two rows in a display device 100 according to embodiments of the present disclosure.

Referring to FIG. 3, a first panel pad row 210 including panel pads and a second panel pad row 210 including panel pads may be disposed in a non-display area N/A of the display panel 110. The pads of the first and second panel pads rows may be arranged along the same direction, e.g., along a first direction. In other words, a panel pad row may be a group of pads disposed in a specific region as illustrated in FIG. 3.

A plurality of data wires DL may be connected to one side of the panel pads of the first panel pad row 210 and the second panel pad row 220, respectively. In other words, the data wires may be extended from the first panel pad row 210 and the second panel pad row 220.

The panel pads arranged in the second panel pad row 220 may be arranged in a zigzag manner with respect to the panel pads arranged in the first panel pad row 210. In other words, the first panel pad row 210 and the second panel pad row 220 are alternatively arranged along a particular direction, e.g. along a first direction.

That is, each panel pad of the second panel pad row 220 may be arranged in corresponding adjacent separation space of the panel pads of the first panel pad row 210. The separation space may be referred to as a space between neighboring pads of a panel pad row.

A width of a separation space of the first panel pad row 210 in a first direction may be equal to or smaller than a width of the corresponding panel pad of the second panel pad row 220 in the first direction.

In addition, some connection wires may be disposed in the separation spaces, respectively. Thus, the separation spaces can be provided for disposing connection wires to reduce the area of the panel pads in the non-display area N/A.

Accordingly, it is possible to provide a panel pad structure, i.e., a panel pad arrangement including a plurality of panel pad rows, in which a plurality of panel pads may be arranged in two rows so as to connect a plurality of data wires DL without disturbance owing to the panel pad structure, thereby realizing a high-resolution display panel.

Figure 4:
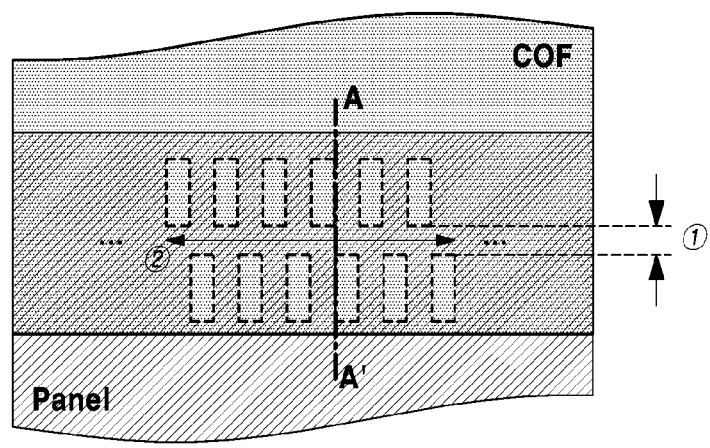
FIG. 4 is a view illustrating an example of a structure in which the panel pads and film pads illustrated in FIG. 3 are bonded to each other.

FIG. 4 illustrates an example of a structure in which the panel pads and film pads illustrated in FIG. 3 are connected to each other.

Referring to FIG. 4, the panel pads on the top surface, e.g., a first surface, of the display panel 110 and the film pads disposed on the bottom surface, e.g., a second surface, of the film are bonded to each other to connect the display panel 110 and the film to each other.

Regarding the structure in which the panel pads and the film pads are bonded to each other, the gap between the first panel pad row 210 and the second panel pad row 220 may be uniform as indicated by ① as illustrated in FIG. 4 to form a straight-line shaped gap area between the first panel pad row 210 and the second panel pad row 220 as indicated by ② as illustrated in FIG. 4. In other words, the edges of the panel pads of the first panel pad row 210 facing the panel pads of the second panel pad row 220 are aligned along a straight line and the edges of the panel pads of the second panel pad row 210 facing the panel pads of the first panel pad row 220 are aligned along a straight line as illustrated in FIG. 4. It should be noted that the straight line in FIG. 4 is illustrated merely for explanation purpose.

In such a panel pad structure, due to the pressure applied during the process of bonding the panel pads and the film pads, the material of the substrate of the display panel 110 located under the panel pads, etc., a swelling phenomenon may occur in the gap indicated by ① as illustrated in FIG. 4 between the first panel pad row 210 and the second panel pad row 220.

Because a swelled region due to the swelling phenomenon may be formed along a straight line as indicated by ② as illustrated in FIG. 4. Consequently, the data wires DL disposed in the gap indicated by ② as illustrated in FIG. 4 may be cracked.

In other words, the data wires DL extended from the panel pads of the first pad row 210 are disposed in the gap between the first panel pad row 210 and the second panel pad row 220. Further, the area between the first panel pad row 210 and the second panel pad row 220 may be suffered by the swelling phenomenon. Accordingly, the data wires passing through the gap between a plurality of panel pad rows may be damaged.

Figure 5:
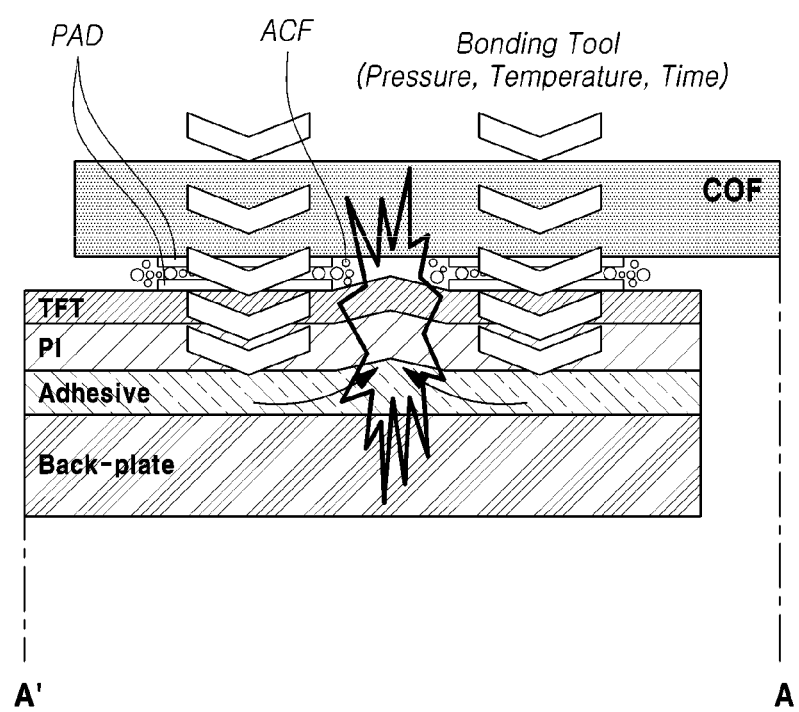
FIG. 5 is a view illustrating an example of a swelling phenomenon which may occur in a process in which the panel pads and film pads illustrated in FIG. 4 are bonded to each other.

FIG. 5 is a view taken along line A-A' in FIG. 4 and illustrating an example of a swelling phenomenon which may occur in a process in which the panel pads and film pads illustrated in FIG. 4 are bonded to each other.

Referring to FIG. 5, an adhesive layer is disposed on a back-plate, and a flexible substrate of the display panel, e.g., a polyimide (PI) substrate, is disposed on the adhesive layer. Then, a TFT layer of the display panel is disposed on the flexible substrate.

The panel pads may be arranged on the TFT layer, and the panel pads are bonded to the film pads disposed on the film. However, the present disclosure is not limited to the position of the panel pads and the panel pads may be arranged in the TFT layer. The panel pads may be formed with at least one material among the materials of the TFT layer. The panel pads may be formed with the same manufacturing process of the TFT layer. However, the present disclosure is not limited thereto.

When the pressure is applied in the bonding process of the panel pads and the film pads, the adhesive under the panel pads may be deformed. In other words, the adhesive between the back-plate and the substrate of the display panel 110 may be deformed due to pressure applied to the panel pads.

When the adhesive is deformed, a swelling phenomenon may deform the flexible substrate and the TFT layer, which are on the adhesive layer.

Particularly, when the substrate, i.e., PI layer, is made of a material having a relatively lower rigidity (e.g., flexible plastic), a swelling phenomenon may occur due to the deformation of the adhesive layer.

Moreover, the panel pads and the film pads may be made of metallic materials having a higher rigidity than the material of the substrate. Thus, the area where the pads are disposed can be less deformed than the area where the pads are not disposed. Consequently, a swelling phenomenon may be occurred in the gap between pads rows wherein the panel pads are not disposed but not in area where the panel pad rows are disposed.

Due to such a swelling phenomenon, the data wires DL disposed in the gap between panel pad rows may be cracked.

Figure 6:
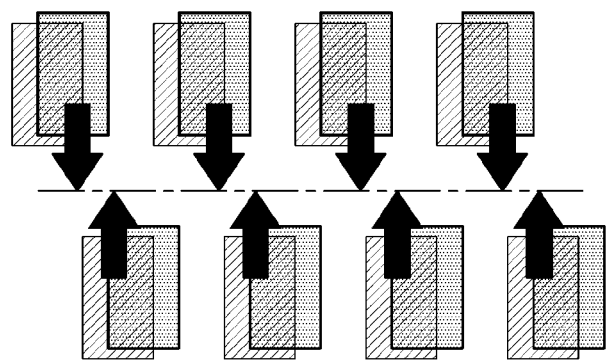
FIG. 6 is a view for describing the cause of defective wiring due to the swelling phenomenon illustrated in FIG. 5.

FIG. 6 is a top view for describing the cause of defective wiring due to the swelling phenomenon as illustrated in FIG. 5. And also FIG. 6 illustrates a perspective view for convenience of description. With reference to a dash line between the first panel pad row and the second panel pad row as illustrated in FIG. 6, a swelled region due to the deformation of the adhesive layer may be formed as a straight line like.

Therefore, the signal wires connected to the panel pads disposed in the swelled region having a shape as like a bar or a straight line at the gap between different panel pad rows, may be cracked. The gap between the panel pad rows may be a narrow space.

According to the embodiments of the present disclosure, a panel pad structure, which can suppress the signal wires from being cracked due to the swelling phenomenon that may occur between two or more rows of panel pads during a bonding process, may be provided.

Figure 7:
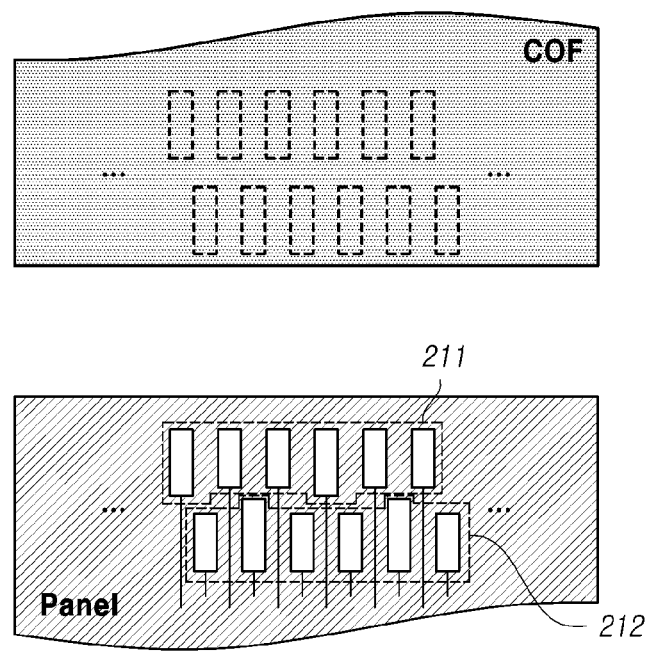
FIG. 7 is a view illustrating an embodiment of a panel pad structure in which panel pads arranged in two rows in a display device according to embodiments of the present disclosure.
Figure 8:
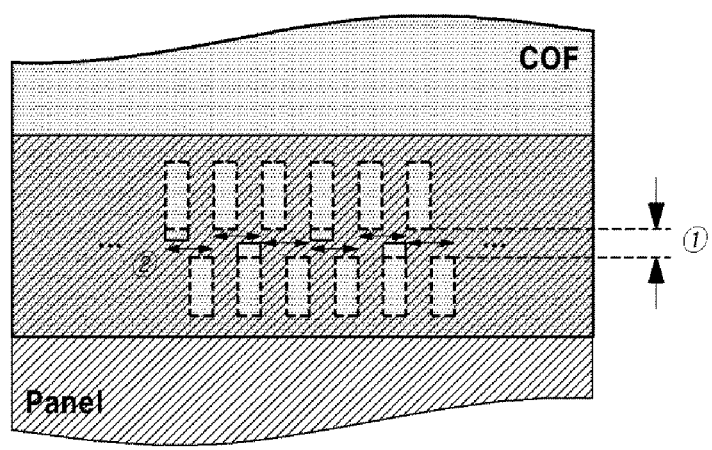
FIG. 8 is a view illustrating an example of a structure in which the panel pads and film pads illustrated in FIG. 7 are bonded to each other.

FIG. 7 is a view illustrating an embodiment of a pad panel structure in which the panel pads are arranged in two rows in a display device 100 according to the embodiments of the present disclosure. FIG. 8 is a view illustrating an example of a structure in which the panel pads and film pads, which are correspondingly arranged in two rows, are bonded to each other.

Referring to FIG. 7, a plurality of panel pads is disposed in the non-display area N/A of the display panel 110.

The plurality of panel pads forms a first panel pad row 211 including a plurality of panel pads arranged in a first direction and a second panel pad row 212 including a plurality of panel pads arranged in the same direction as the first panel pad row 211.

Respective panel pads of the first and second panel pad row 211 and 212 may be connected to respective connection wires.

An edge where the panel pads are connected to the connection wirings will be referred to as the first edge and another edge opposite to the first edge will be referred to as the second edge. Further, the other edges different from the first edge or the second edge may be referred to as the side edges.

The connection wires are respectively connected to the first edges of the panel pads of the first and second panel pad rows 211 and 212. Thus, the connection wires extended from the respective panel pads of the first and second panel pad rows are alternatively arranged. In addition, the panel pads of the first panel pad row 211 and the second panel pad row 212 may be arranged in a zigzag manner as illustrated in FIG. 7.

Further, a panel pad among the panel pads of the second panel pad row 212 may be aligned at the separation space between two adjacent panel pads of the first panel pad row 211 in a second direction perpendicular to the first direction. However, the present disclosure is not limited to the term "perpendicular" and the first direction and the second direction may form a particular angle.

In addition, a width of the separation space between the panel pads of the first panel pad row 211 may be smaller than a width of an adjacent panel pad of the second panel pad row 212. Consequently, at least a portion of the first edge of the panel pads of the first panel pad row 211 may be overlapped with at least a portion of the second edge of the adjacent panel pad of the second panel pad row 212.

By overlapping at least a portion of corresponding edges of the panel pads of a panel pad row with a portion of corresponding edges of the panel pads of another panel pad row in a first direction, the more panel pads can be arranged compared to a non-overlapping panel pads arrangement in a first direction. Consequently, relatively a larger number of signal wires and a larger number of panel pads can be arranged in comparison with the non-overlapping panel pads arrangement in terms of the same area of the panel pads, thereby a high-resolution display device can be realized.

At least one panel pad of the first panel pad row 211 may be extended in a second direction. That is, at least one panel pad of the first panel pad row 211 may be longer than other panel pads of the first panel pad row 211 in the second direction.

In other words, at least one panel pad of the first panel pad row 211 may be extended towards to the second panel pad row 212 with a particular arrangement and at least one panel pad of the second panel pad row 211 may be extended towards to the first panel pad row 212 with a particular arrangement.

Alternatively, at least two panel pads of the first panel pad row 211 may be shifted toward the second panel pad row 212. That is, the shifted panel pad may have a same length as the non-shifted panel pad. In addition, at least one non-shifted panel pad may be disposed between the shifted panel pads.

Since at least two panel pads of the first and/or second panel pad row are extended or shifted, the facing edges of the panel pads, e.g., the first edge of panel pads of the first panel pad row 211 and the second edge of the panel pads of the second panel pad row 212, may not be arranged as a straight line shape in view of the shape of the gap between the panel pad rows. A contour of the gap between the panel pad rows may include concave and convex sections due to the extended pads or shifted pads. For example, a portion of the contour of the gap along an edge of an extended pad (e.g., bottom edge of a first or left most pad in a first panel pad row 211) may correspond to a concave portion of the contour of the gap, while a portion of the contour of the gap along a non-extended pad (e.g., bottom edge of a second pad to the right of the first pad in a first panel pad row 211) may correspond to a convex portion of the contour of the gap. In another example, a contour of the gap along a shifted pad may correspond to a concave portion of the gap while a contour of the gap along a non-shifted pad may correspond to a convex portion of the gap. The panel pads may include at least one particular panel pad having a shape different from a shape of other panel pads to form a concave section or a convex section of the contour of the gap between the panel pad rows. The panel pads may include at least one particular panel pad shifted from other panel pads to form a concave section or a convex section of the contour of the at least one gap between the panel pad rows.

At least two panel pads of the second panel pad row 212 may be extended toward the second panel pad row 211. At least one panel pad having a non-extended shape may be disposed between the panel pads having an extended shape.

In addition, the extended shape of the panel pad may be referred to as a first panel pad shape and the non-extended shape of the panel pad may be referred to as a second panel pad shape. The first panel pad shape and the second panel pad shape may have the same width but the first panel pad shape may have a longer length than a length of the second panel pad shape.

Alternatively, at least two panel pads of the second panel pad row 212 may be shifted toward the second panel pad row 211. At least one non-shifted panel pad may be disposed between the shifted panel pads.

Since at least two panel pads of the second panel pad row 212 are extended or shifted, the first edges and/or the second edges of the panel pads of at least one panel pad row among the plurality of panel pad rows may not be arranged as the straight line.

Here, the extended or shifted panel pads among the panel pads included in the first panel pad row 211 and the extended or shifted panel pads among the panel pads included in the second panel pad row 212 may be arranged alternately.

In addition, since the panel pads of the first panel pad row 211 and the panel pads of the second panel pad row 212 are selectively extended or shifted, at least one first edge among the panel pads of the first panel pad row 211 may be adjacent to the active area A/A than at least one second edge among the panel pads of the second panel pad row 212.

According to such a panel pad structure, the shape of the areas corresponding to the gap between the first panel pad row 211 and the second panel pad row 212 may be a non-straight line shape. Accordingly, the shape of the space is dispersed rather than being positioned in a straight line in order to reduce the swelling phenomenon.

Accordingly, swelled regions formed by the deformation of the adhesive layer between the panel pads of the first panel pad row 211 and the second panel pad row 212 can be dispersed rather than forming a straight line.

That is, as illustrated in FIG. 8, in a region indicated by ① between the first panel pad row 211 and the second panel pad row 212, the swelled region is formed as a section as indicated by ②. In other words, a plurality of swelled regions may be formed between the panel pad rows where the region between the panel pad rows is not a straight line shape.

Accordingly, since the swelled regions between the first panel pad row 211 and the second panel pad row 212 are divided into sections rather than forming a straight line, the stress applied to the signal wires, that is, the connection wires connected to the inner edge of the first panel pad row 211, can be reduced.

This configuration can increase the number of signal wires for higher pixel resolution. Further, this configuration may prevent wires from being cracked which may occur due to a swelling phenomenon in a region between adjacent panel pad rows.

In addition, since the material of the pad is rigid and the pad having a rigid characteristic is extended towards the gap between the panel pad rows, the pad can reduce a degree of deformation of the adhesive layer by the rigidity of the extended or shifted pad configuration.

Figure 9:
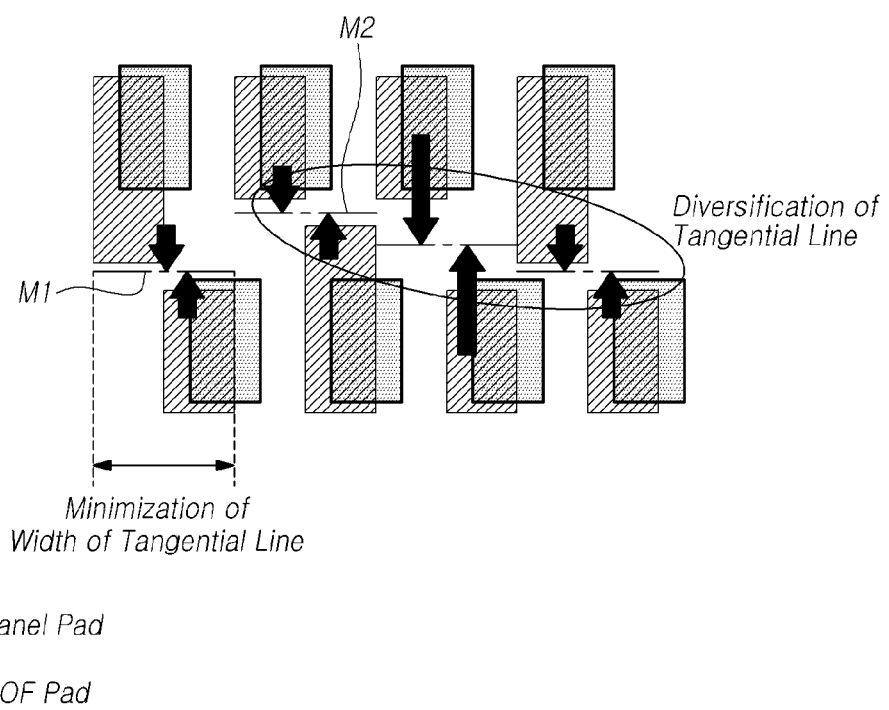
FIG. 9 is a view illustrating an example in which regions in which a swelled region occurs are dispersed in a structure of panel pads illustrated in FIG. 8.

FIG. 9 is a top view illustrating an example in which regions in which a swelling phenomenon occurs are dispersed in a structure of panel pads as illustrated in FIG. 8. And also FIG. 9 illustrates a perspective view for convenience of description.

Referring to FIG. 9, exemplary four panel pads among the first panel pad row 211 are illustrated merely for illustrative purpose. The first panel pad of the first panel pad row 211 is positioned at the left end. The first panel pad of the first panel pad row 211 is extended toward the second panel pad row 212. That is, the first panel pad is formed as an extended form. The second panel pad of the first panel pad row 211 is positioned on the right side of the first panel pad, the third panel pad of the first panel pad row 211 is positioned on the right side of the second panel pad, and the fourth panel pad of the first panel pad row 211 is positioned on the right side of the third panel pad. In addition, the second panel pad and the third panel pad of the first panel pad row 211 are formed as a non-extended shape, and the first and fourth panel pads are formed as an extended form.

Referring to FIG. 9, exemplary four panel pads among the second panel pad row 212 are illustrated merely for illustrative purpose. The first panel pad of the second panel pad row 212 is positioned at the left end, the second panel pad of the second panel pad row 212 is positioned on the right side of the first panel pad, the third panel pad of the second panel pad row 212 is positioned on the right side of the second panel pad, and the fourth panel pad of the second panel pad row 212 is positioned on the right side of the third panel pad. The second panel pad among the panel pads included in the second panel pad row 212 is extended toward the first panel pad row 211. In addition, the remaining panel pads are formed as a non-extended form.

Accordingly, the first swelled region between the first panel pad of the first panel pad row 211 and the first panel pad of the second panel pad row 212 is not located on one straight line with the second swelled region between the second panel pad of the first panel pad row 211 and the second panel pad of the second panel pad row 212.

In other words, the middle position M1 between corresponding first pads of the first and second panel pad rows 211 and 212 and the middle position M2 between corresponding second pads of the first and second panel pad rows 211 and 212 are misaligned so as to reduce a degree of swelling phenomenon.

The middle position between corresponding pads of the first and second panel pad rows 211 and 212 may be represented by a middle line segment (e.g., "tangential line"). The middle line segment is a virtual line positioned between panel pad rows. The middle line segment may be an area in which a stress is most applied. For example, the middle line segment corresponding to the first pads of the first and second panel pad rows 211 and 212 is parallel to the first direction (e.g., adjacent or facing edges of the first pads are parallel to a first direction, a horizontal direction in FIG. 9) and located between the left most boundary of the first pad in the first panel pad row 211 and the right most boundary of the first pad in the second panel pad row 212 (e.g., outside edges of the first pads parallel to a second direction, a vertical direction in FIG. 9). In one aspect, the middle line segment is placed at a same distance from an edge of the first pad of the first panel pad row and an edge of the first pad of the second panel pad row (e.g., adjacent or facing edges in a horizontal direction in FIG. 9 of the first pads in the first panel pad row and the second panel pad rows).

Likewise, the third swelled region between corresponding third panel pads and the fourth swelled region between respective fourth panel pads are also not located on one straight line, e.g., diversification of tangential line.

As described above, the swelled regions between the panel pads of the first panel pad row 211 and the panel pads of the second panel pad row 212 are dispersed at short intervals (minimization of a width of tangential line), rather than Riming a single straight line.

That is, assuming that a straight line connecting the center of gravity of each of the panel pads included in the first panel pad row 211 to the center of gravity of a panel pad adjacent thereto is a transverse axis line, a transverse axis line connecting the centers of gravity of adjacent panel pads may have a slope different from that of a transverse axis line adjacent thereto. The transverse axis may be referred to as a first direction.

In addition, assuming that straight lines connecting the centers of gravity of respective panel pads included in the first panel pad row 211 to the centers of gravity of respective panel pads included in the second panel pad row 212 are longitudinal axis lines, adjacent longitudinal straight line may have different lengths. The longitudinal axis may be referred to as a second direction different from the first direction.

By making transverse axis lines each connecting the centers of gravity of the panel pads arranged in the same panel pad row have different slopes or by making the longitudinal axis lines connecting the centers of gravity of the panel pads arranged in the different panel pad rows have different lengths, swelled regions between different pad rows are not located on a straight line.

Accordingly, the swelled regions between the first panel pad row 211 and the second panel pad row 212 reduce a force exerted on the signal wires, thereby reducing the signal wires from being cracked.

In addition, the maximum thickness with respect to the misaligned swelled regions may be thinner than the maximum thickness with respect to the single straight line swelled region. Consequently, the stress that can be exerted on the signal wires can be reduced.

Figure 10:
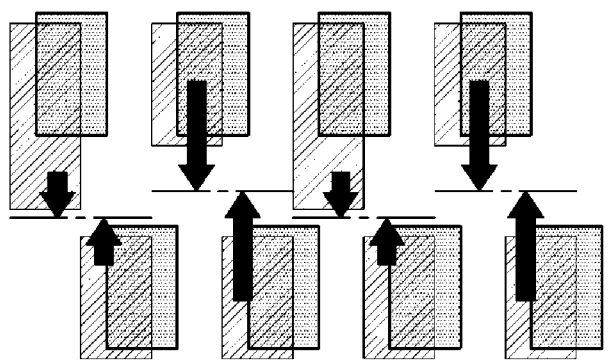
FIGS. 10 and 11 are views illustrating other embodiments of the panel pad structure in which panel pads arranged in two rows in a display device according to embodiments of the present disclosure.
Figure 11:
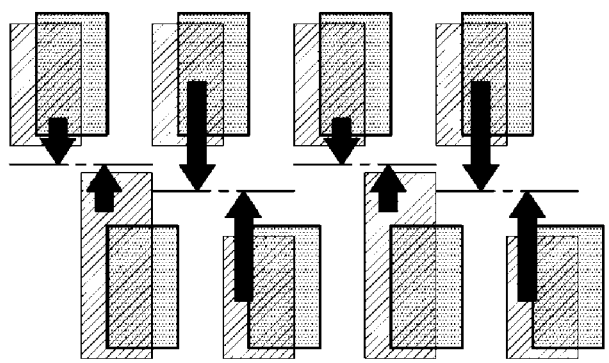

FIGS. 10 and 11 are top views illustrating other embodiments of the structure of panel pads arranged in two rows in a display device according to embodiments of the present disclosure. And also FIGS. 10 and 11 illustrate perspective views for convenience of description.

Referring to FIG. 10, the first panel pad and the third panel pad among the panel pads of the first panel pad row 211 are arranged in a form extended toward the second panel pad row 212. Alternatively, the first panel pad and the third panel pad may be disposed in a form shifted toward the second panel pad row 212.

In addition, the second panel pad and the fourth panel pad among the panel pads of the first panel pad row 211 are arranged in a non-extended form. Alternatively, the second panel pad and the fourth panel pad may not be shifted toward the second panel pad row 212.

All the panel pads of the second panel pad row 212 may be arranged in the same form.

Therefore, only one panel pad row may be configured to include at least two extended panel pads and the other panel pad row may be configured to exclude extended panel pads. For example, the panel pads included in the first panel pad row 211 may be implemented with an extended form or a shifted structure, or by arranging the extended or shifted panel pads at particular intervals, the swelled regions between the panel pads of the first panel pad row 211 and the panel pad of the second panel pad row 212 may not form a straight line.

Since the swelled regions between the first panel pad row 211 and the second panel pad row 212 do not form a straight line, the level of deformation with respect to the swelled region can be reduced. Thus, it is possible to suppress the signal wires arranged in the swelled regions from being damaged.

In addition, among the panel pads of the first panel pad row 211, the panel pads extended or shifted toward the second panel row 212 may be arranged to be adjacent to each other with a predetermined number of panel pads.

For example, two consecutive panel pads are arranged with extended form or shifted form, and then the next two consecutive panel pads are arranged in a non-extended form and non-shifted form.

In other words, a particular group of the panel pads and another particular group of the panel pads among a panel pad row may be arranged with a particular arrangement having a first length of the panel pads and a second length of the panel pads to avoid a straight line swelled region phenomenon.

In other words, a particular group of the panel pads and another particular group of the panel pads may be arranged with a particular arrangement having a first length of the panel pads having a particularly shifted arrangement pattern to avoid a straight line swelled region phenomenon.

That is, in the embodiments of the present disclosure, by shifting respective gaps between the first panel pad row 211 and the second panel pad row 212 into a plurality of sections to avoid a straight line shape, signal wires can be suppressed from being cracked due to the swelling phenomenon.

In some embodiments, the shapes of the panel pad rows and arrangement structure of the panel pads can be variously implemented.

Referring to FIG. 11, all the panel pads included in the first panel pad row 211 may be arranged in the same shape.

In addition, the first panel pad and the third panel among the panel pads of the second panel pad row 212 may be extended toward the first panel pad row 211. Alternatively, the first panel pad and the third panel pad may be shifted toward the first panel pad row 211 while the first panel pad and the third panel pad have the same shape as the shape of the other panel pads.

The second panel pad and the fourth panel pad of the second panel pad row 212 may be arranged in a non-extended form. Alternatively, the second panel pad and the fourth panel pad may be disposed in a structure non-shifted toward the first panel pad row 211.

In other words, the non-shift panel pads structure may be referred to as the shifted outwards structure.

That is, by arranging some of the panel pads of the second panel pad row 212 in an extended form or shifted structure in the state in which the shape and arrangement of the panel pads of the first panel pad row 211 are adjusted, it is possible to make the swelled regions between the first panel pad row 211 and the second panel pad row 212 dispersed in sections.

Accordingly, through various structures in which some of the panel pads of the first panel pad row 211 and the second panel pad row 212 are arranged to be extended or shifted toward the other panel pads, it is possible to make a plurality of swelled regions between the first panel pad row 211 and the second panel pad row 212, thereby suppressing the signal wires from being cracked.

Meanwhile, all the embodiments of the present disclosure can be applied to a structure in which panel pads are formed of two or more rows. For example, even in a panel pad structure in which panel pads are arranged in three rows, a structure in which swelled regions between panel pad rows are dispersed in sections.

Figure 12:
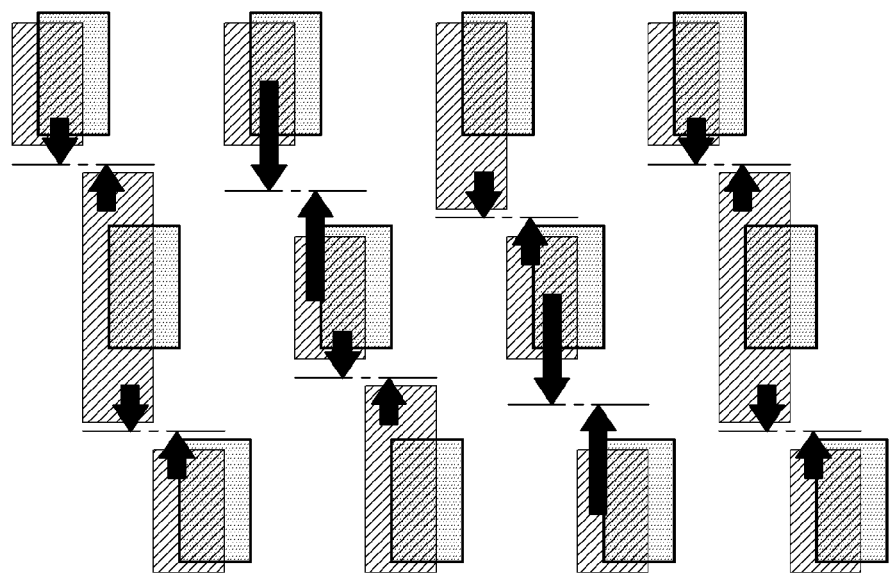
FIGS. 12 and 13 are views illustrating embodiments of a panel pad structure in which panel pads are arranged in three rows in a display device according to embodiments of the present disclosure.
Figure 13:
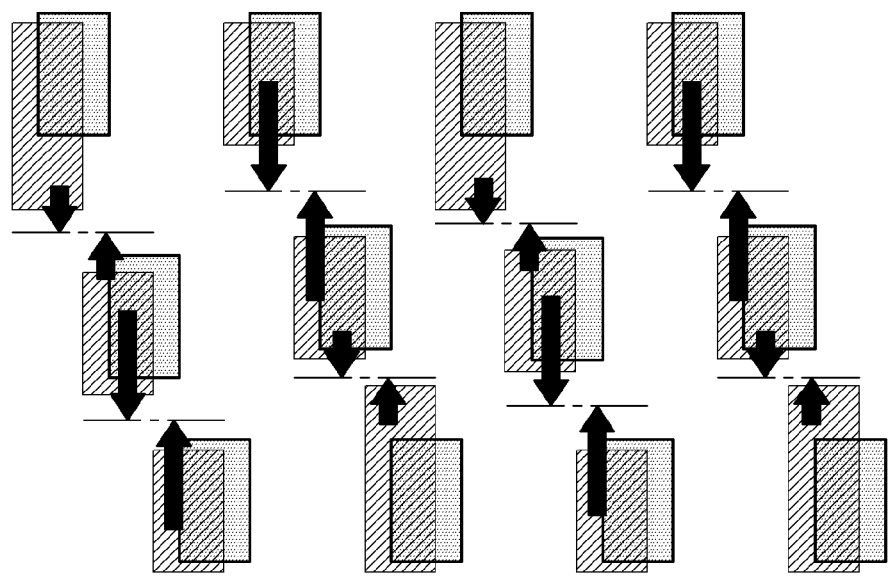

FIGS. 12 and 13 are top views illustrating embodiments of a panel pad structure in which panel pads are arranged in three rows in a display device 100 according to embodiments of the present disclosure. And also FIGS. 12 and 13 illustrate perspective views for convenience of description.

Referring to FIG. 12, a plurality of panel pads arranged in the non-display area N/A of the display panel 110 may be arranged in three panel pad rows.

Some of the panel pads included in the outermost panel pad row among the three panel pad rows may be arranged in an inwardly extended form. Alternatively, some of the panel pads of the outermost panel pad row may be arranged in an inwardly shifted form.

In addition, some of the panel pads included in the inwardly disposed panel pad row may be arranged in an extended form.

For example, the third panel pad among the panel pads arranged in the first panel pad row is arranged in an inwardly extended form. In addition, the second panel pad among the panel pads arranged in the third panel pad row is disposed in an inwardly extended form.

The first panel pad and the fourth panel pad among the panel pads arranged in the second panel pad row are arranged in an extended form.

Therefore, since the regions between the panel pads arranged in the first panel pad row and the panel pads arranged in the second panel pad row are not located on a straight line, the swelled regions between the panel pads can be dispersed in a plurality of sections.

In addition, the swelled regions between the panel pads arranged in the two rows and the panel pads arranged in the three rows can also be dispersed in a plurality of sections.

Therefore, by the swelled regions between the panel pads arranged in different panel pad rows, force applied to signal wires can be reduced and signal wires can be suppressed from being cracked.

FIG. 13 illustrates another embodiment of a panel pad structure in which panel pads are arranged in three panel pad rows.

Referring to FIG. 13, some of the panel pads included in the outermost panel pad row are arranged in an inwardly extended or shifted form. In addition, all the panel pads included in the inwardly arranged panel pad row have the same shape, and some panel pads may be arranged in a form shifted toward another panel pad row.

For example, the first panel pad and the third panel pad among the panel pads of the first panel pad row may be arranged in an inwardly extended or shifted form. In addition, the second panel pad and the fourth panel pad among the panel pads of the third panel pad row are arranged in an inwardly extended or shifted form.

All the panel pads of the second panel pad row are arranged in the same form, and the first and third panel pads are arranged in the form shifted toward the third panel pad row. In addition, the second panel pad and the fourth panel pad are arranged in a form shifted toward the first panel pad row.

Accordingly, the outermost panel pads are arranged in an extended form, and the inwardly arranged panel pads are arranged in a shifted structure without being extended, so that the regions between the panel pad rows are formed in sections, thereby preventing signal wires from cracking due to the swelling phenomenon.

Meanwhile, at the time of applying a panel pad structure according to embodiments of the present disclosure, film pads connected to panel pads may be arranged in the same shape and structure as the panel pads. Accordingly, since the panel pads and the film pads are arranged in the same shape and structure, swelled regions between different panel pad rows can be arranged to be dispersed in sections.

Alternatively, the film pads connected to the panel pads may have a constant shape and structure regardless of the shape and structure of the panel pads. Therefore, it is possible to reduce signal wires from being cracked due to the reduced swelling phenomenon through the shape or structure of the panel pads without changing the shape or structure of the film pads.

In addition, although the embodiments of the present disclosure have been described with reference to panel pads disposed in the non-display area N/A of a display panel 110, the embodiments of the present disclosure may be applied to all the pads arranged in two or more rows in the display device 100.

For example, the embodiments of the present disclosure may be applied to pads arranged in the case where a drive circuit is implemented in a type other than a COF type, and may also be applied to pads arranged in a portion where the film is connected to a PCB.

According to the embodiments of the present disclosure, in a panel pad structure including two or more rows, by arranging some of the panel pads of any one row to be extended or shifted toward the other panel pads, regions between panel pads of different rows may be positioned to be dispersed in sections.

According to some embodiments of the present disclosure, a pad structure capable of minimizing defective crack in signal wires due to a swelling phenomenon of a circuit board between pads arranged in different rows in the process of bonding pads arranged in two or more rows.

According to some embodiments of the present disclosure, a display panel includes a plurality of signal wires arranged in an active area, a plurality of connection wires arranged in a non-display area which is an outer area of the active area and integrated with or connected to the plurality of signal wires, and a plurality of panel pads located in the non-display area and connected to the plurality of connection wires.

The plurality of panel pads may form a first panel pad row including two or more panel pads arranged in one direction, and a second panel pad row including two or more panel pads arranged in a region corresponding to a region between the panel pads included in the first panel pad rows, and some of the plurality of panel pads included in the first panel pad row and the second panel pad row may be arranged in a form extended toward the other panel pad row.

Alternatively, the plurality of panel pads may form two or more panel pad rows each including two or more pads, and some of the plurality of panel pads included in an outermost panel pad row among the two or more panel pad rows may be arranged in an inwardly extended form.

Alternatively, the plurality of panel pads form a first panel pad row including two or more panel pads and a second panel pad row including two or more panel pads. The second panel pad row may be located closer to the active area than the first panel pad row, and at least two panel pads included in the first panel pad row and two or more panel pads included in the second panel pad row have inner edges to which the connection wires are connected, respectively, and outer edges opposite the inner edges. The inner edges of two or more respective panel pads included in the first panel pad row may not be located on one straight line, or the outer edges of two or more respective panel pads included in the second panel pad row may not be located on one straight line.

According to some embodiments of the present disclosure, a display device includes a display panel including an active area and a non-display area which is an outer area of the active area and including a plurality of panel pads arranged in the non-display area, and a film having a plurality of film pads connected to the plurality of panel pads, respectively, and a printed circuit mounted thereon. The plurality of panel pads form a first panel pad row including two or more panel pads arranged in one direction, and a second panel pad row including two or more panel pads arranged in a region corresponding to a region between the panel pads included in the first panel pad rows. The plurality of panel pads have centers of weight, respectively, a plurality of traverse axis straight lines appear when one of the centers of weight is connected to other centers of weight of the panel pads in the same row, and the plurality of transverse axis lines have a slope different from a slope of other transverse axis lines connected in close proximity.

According to embodiments of the present disclosure, in a pad structure in which pads are arranged in two or more rows, by arranging some of the pads arranged in different rows to be extended or shifted toward the other rows, regions in which a swelling phenomenon occurs between the pads of the different rows may not to be located on a straight line.

Accordingly, by making swelled regions between the pads of different rows dispersed, the signal wires, which are connected to the pads via the swelled regions, can be prevented from cracking.

Through this, even if a swelling phenomenon occurs between the panel pads of different rows in the bonding process of the panel pads, the force applied by the swelled region is dispersed, so that stress exerted on the signal wires disposed between the panel pads of the different rows can be reduced.

Accordingly, it is possible to provide a robust signal wire structure in a structure in which panel pads connected to a plurality of signal wires for implementing high-resolution are arranged in a plurality of rows.

An aspect of the embodiments of the present disclosure may be to provide a display panel comprising a plurality of signal wires arranged in an active area, a plurality of connection wires, arranged in a non-display area adjacent to the active area, electrically connected to the plurality of signal wires, and a plurality of panel pads, in the non-display area, electrically connected to the plurality of connection wires comprising a first panel pad row among the plurality of panel pads arranged in a first direction, a second panel pad row among the plurality of panel pads arranged in the first direction, and a gap between the first panel pad row and the second panel pad row along the first direction, wherein the first panel pad row and the second panel pad row include a plurality of extended panel pads extended toward an adjacent panel pad row so as to reduce a swelled region in the gap.

At least two panel pads of the first panel pad row may be extended toward the second panel pad row, at least two panel pads of the second panel pad row may be extended toward the first panel pad row, and the extended panel pads of the first and second panel pad rows are alternately arranged.

At least one panel pad shorter than the plurality of extended panel pads of the first panel pad row may be positioned between the plurality of extended panel pads in the first panel pad row, and at least one panel pad shorter than the plurality of extended panel pads of the second panel pad row may be positioned between the plurality of extended panel pads in the second panel pad row.

At least two panel pads of the first panel pad row may be longer than the other panel pads of the first panel pad row, and a width of the plurality of panel pads of the first panel pad row may be the same.

At least two panel pads of the first panel pad row are extended toward the second panel pad row and the extended panel pads may be arranged with a particular arrangement pattern.

A first width of the panel pads of the first panel pad row may be wider than a separation space between the panel pads of the first panel pad row along the first direction, and a second width of the panel pads of the second panel pad row may be wider than a separation space between the panel pads of the second panel pad row along the first direction.

The display panel may include a film comprising a plurality of film pads correspondingly bonded to the plurality of panel pads, the plurality of film pads of the film has the same shape, and the extended panel pads among the first and second panel pad rows may be larger than the plurality of film pads.

The display panel may include a film comprising a plurality of film pad rows and a plurality of swelled regions formed in a misaligned manner in the first direction between the plurality of film pad rows.

Another aspect of the embodiments of the present disclosure may be to provide a display panel comprising a plurality of panel pads comprising a plurality of panel pad rows arranged in a first direction in a non-display area, at least one gap between the plurality of panel pad rows in the first direction, a plurality of connection wires extended from the plurality of panel pads, respectively, and towards a display area adjacent to the non-display area, wherein the plurality of connection wires, may be extended from one panel pad row among the plurality of panel pad rows, may be passing through the at least one gap, and may be passing through respective separation spaces between the plurality of panel pads of adjacent panel pad row, wherein the at least one gap between the plurality of panel pad rows comprises a plurality of sections due to a plurality of extended pads of the plurality of panel pad rows.

The plurality of panel pads includes at least one particular panel pad having a shape different from the other panel pad shape, wherein the at least one particular panel pad divides a swelled region into a plurality of sections.

The plurality of panel pads may include at least one particular panel pad shifted from the other panel pad, wherein the at least one particular panel pad divides the plurality of swelled regions.

The other aspect of the embodiments of the present disclosure may be to provide a display device comprising a back-plate, an adhesive layer on the back-plate, a flexible substrate on the adhesive layer, a plurality of panel pad rows on the flexible substrate, a first gap between the plurality of panel pad rows, a plurality of film pad rows bonded to the plurality of panel pad rows, a second gap between the plurality of film pad rows, and a film on the plurality of film pad rows, wherein at least two misaligned swelled regions are formed between the plurality of panel pad rows along a first direction.

The at least two misaligned swelled regions may be formed in accordance with shapes of a plurality of panel pads of the plurality of panel pad rows.

The plurality of panel pads of the plurality of panel pad rows may include at least one extended pads in a second direction different from the first direction or at least one shifted pads in the second direction.

The plurality of panel pads may have a rigid characteristic and the at least two misaligned swelled regions are divided by the at least one extended pads or the at least one shifted pads.

The at least two misaligned swelled regions may be generated by deformation of the adhesive layer and a flexible characteristic of the flexible substrate.

The first gap may be divided into sections in accordance with at least two extended or shifted panel pads of the plurality of panel pad rows.

The second gap may be divided into sections in accordance with at least two extended or shifted panel pads of the plurality of panel pad rows.

Although a preferred embodiment of the present disclosure has been described for illustrative purposes, those skilled in the art will appreciate that various modifications, additions and substitutions are possible, without departing from the scope and spirit of the disclosure as disclosed in the accompanying claims. Therefore, exemplary embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A display panel comprising:
a plurality of signal wires arranged in an active area;
a plurality of connection wires, arranged in a non-display area adjacent to the active area, electrically connected to the plurality of signal wires; and
a plurality of panel pads, in the non-display area, electrically connected to the plurality of connection wires comprising:
a first panel pad row among the plurality of panel pads arranged in a first direction,
a second panel pad row among the plurality of panel pads arranged in the first direction, and
a gap between the first panel pad row and the second panel pad row along the first direction,
wherein at least one of the first panel pad row and the second panel pad row include a plurality of extended panel pads extended toward an adjacent panel pad row so as to reduce swelling in the gap.

2. The display panel of claim 1,
wherein at least two panel pads of the first panel pad row are extended toward the second panel pad row,
wherein at least two panel pads of the second panel pad row are extended toward the first panel pad row, and
wherein the extended panel pads of the first and second panel pad rows are alternately arranged.

3. The display panel of claim 2,
wherein at least one panel pad shorter than the plurality of extended panel pads of the first panel pad row is positioned between the plurality of extended panel pads in the first panel pad row, and
wherein at least one panel pad shorter than the plurality of extended panel pads of the second panel pad row is positioned between the plurality of extended panel pads in the second panel pad row.

4. The display panel of claim 1, wherein at least two panel pads of the first panel pad row are longer than other panel pads of the first panel pad row, and the plurality of panel pads of the first panel pad row have a same width.

5. The display panel of claim 1, wherein at least two panel pads of the first panel pad row are extended toward the second panel pad row.

6. The display panel of claim 1, wherein a first width of the panel pads of the first panel pad row is wider than a separation space between the panel pads of the first panel pad row along the first direction, and wherein a second width of the panel pads of the second panel pad row is wider than a separation space between the panel pads of the second panel pad row along the first direction.

7. The display panel of claim 1, further comprising:
a film comprising a plurality of film pads correspondingly bonded to the plurality of panel pads,
wherein the plurality of film pads of the film have a same shape, and
wherein the extended panel pads among the first and second panel pad rows are larger than the plurality of film pads.

8. The display panel of claim 1, further comprising:
a film comprising a plurality of film pad rows and a plurality of swelled regions formed in a misaligned manner in the first direction between the plurality of film pad rows.

9. The display panel of claim 1, further comprising:
a third panel pad row among the plurality of panel pads arranged in the first direction, a second gap between the second panel pad row and the third panel pad row along the first direction, wherein the adjacent panel pad row of the second panel pad row includes the first panel pad row and the third panel pad row.

10. The display panel of claim 9, wherein the third panel pad row includes at least one panel pad extended toward the second panel pad row.

11. A display panel comprising:
a plurality of panel pads comprising a plurality of panel pad rows arranged in a first direction in a non-display area;
at least one gap between the plurality of panel pad rows in the first direction;
a plurality of connection wires extended from the plurality of panel pads, respectively, and towards a display area adjacent to the non-display area,
wherein the plurality of connection wires is extended from one panel pad row among the plurality of panel pad rows, is passing through the at least one gap, and is passing through respective separation spaces between the plurality of panel pads of an adjacent panel pad row,
wherein a contour of the at least one gap between the plurality of panel pad rows comprises concave and convex sections due to a plurality of extended pads of the plurality of panel pad rows.

12. The display panel of claim 11, wherein the plurality of panel pads includes at least one particular panel pad having a shape different from a shape of other panel pads to form a concave section or a convex section of the contour of the at least one gap.

13. The display panel of claim 11, wherein the plurality of panel pads includes at least one particular panel pad shifted from other panel pads to form a concave section or a convex section of the contour of the at least one gap.

14. A display device comprising:
a back-plate;
an adhesive layer on the back-plate;
a flexible substrate on the adhesive layer;
a plurality of panel pad rows on the flexible substrate;
a first gap between the plurality of panel pad rows;
a plurality of film pad rows bonded to the plurality of panel pad rows;
a second gap between the plurality of film pad rows; and
a film on the plurality of film pad rows,
wherein a first middle line segment along a first direction between a first panel pad in a first panel pad row and a first panel pad in a second panel pad row is misaligned from a second middle line segment between a second panel pad in the first panel pad row and a second panel pad in a second panel pad row, wherein the first middle line segment is at a same distance from an edge of the first panel pad in the first panel pad row and an edge of the first panel pad in the second panel pad row, and the second middle line segment is at a same distance from an edge of the second panel pad in the first panel pad row and an edge of the second panel pad in the second panel pad row.

15. The display device of claim 14, wherein the plurality of panel pads of the plurality of panel pad rows include at least one extended pad in a second direction different from the first direction.

16. The display device of claim 14, wherein the plurality of panel pads of the plurality of panel pad rows include at least one shifted pad in a second direction different from the first direction.

17. The display device of claim 16, wherein the plurality of panel pads has a rigid characteristic.

18. The display device of claim 17, wherein two misaligned swelled regions are generated by deformation of the adhesive layer and a flexible characteristic of the flexible substrate.

19. The display device of claim 14, wherein the first gap is divided into sections in accordance with at least two extended or shifted panel pads of the plurality of panel pad rows.

20. The display device of claim 19, wherein the second gap is divided into sections in accordance with at least two extended or shifted panel pads of the plurality of panel pad rows.

* * * * *